United States Patent
Ueta

(10) Patent No.: US 9,907,189 B2
(45) Date of Patent: Feb. 27, 2018

(54) MULTI-LAYER WIRING BOARD AND METHOD OF MANUFACTURING THE SAME

(71) Applicant: FUJIKURA LTD., Tokyo (JP)

(72) Inventor: Nobuki Ueta, Tokyo (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 14/257,192

(22) Filed: Apr. 21, 2014

(65) Prior Publication Data

US 2014/0311773 A1 Oct. 23, 2014

(30) Foreign Application Priority Data

Apr. 22, 2013 (JP) .................................. 2013-089169

(51) Int. Cl.
- *H05K 1/02* (2006.01)
- *H05K 3/46* (2006.01)
- *H05K 1/18* (2006.01)

(52) U.S. Cl.
CPC ........... *H05K 3/4697* (2013.01); *H05K 1/186* (2013.01); *H05K 1/189* (2013.01); *H05K 3/4635* (2013.01); *H05K 2201/0133* (2013.01); *H05K 2201/09563* (2013.01); *H05K 2201/10674* (2013.01); *H05K 2203/063* (2013.01); *Y10T 29/49126* (2015.01)

(58) Field of Classification Search
CPC .................... H05K 1/186; H05K 1/189; H05K 2201/0133; H05K 2201/0314; H05K 2201/03162; H05K 3/366; H05K 3/368; H05K 1/142; H05K 1/144

See application file for complete search history.

(56) References Cited

U.S. PATENT DOCUMENTS

| 4,066,851 A | * | 1/1978 | White | H01H 1/403 200/292 |
| 5,009,496 A | * | 4/1991 | Holtan, Jr. | G02C 3/02 351/123 |
| 5,831,218 A | * | 11/1998 | Hu | H05K 3/0052 174/250 |

(Continued)

FOREIGN PATENT DOCUMENTS

| JP | 1-312434 A | 12/1989 |
| JP | 3-113334 A | 5/1991 |

(Continued)

*Primary Examiner* — Ishwarbhai B Patel
*Assistant Examiner* — Paresh Paghadal
(74) *Attorney, Agent, or Firm* — Westerman, Hattori, Daniels & Adrian, LLP

(57) ABSTRACT

A multi-layer wiring board is configured having stacked therein, in a stacking direction, via an adhesive layer, a plurality of printed wiring bases in each of which a wiring pattern and a via are formed on/in a resin base. A multi-layer wiring board includes a movable portion configured from an elastic member and a void portion, the movable portion being formed in the printed wiring bases and adhesive layer in a periphery of a matrix-shaped plurality of multi-layer wiring portions disposed at a certain interval as viewed in a planar manner, and the movable portion joining the plurality of multi-layer wiring portions such that each of the multi-layer wiring portions is displaceable in the stacking direction and a direction of surfaces of the printed wiring bases.

6 Claims, 11 Drawing Sheets

A – A' Cross-Section

(56) References Cited

U.S. PATENT DOCUMENTS

| | | | | |
|---|---|---|---|---|
| 6,208,521 | B1* | 3/2001 | Nakatsuka | H01L 23/5387 174/254 |
| 6,573,028 | B1* | 6/2003 | Yamamoto | H01L 21/561 257/E23.004 |
| 7,235,423 | B1* | 6/2007 | Wang | H01L 21/561 257/E21.7 |
| 2008/0273299 | A1* | 11/2008 | Tsai | H01L 21/561 361/679.32 |
| 2009/0013526 | A1* | 1/2009 | Yang | H05K 3/0097 29/835 |
| 2009/0283891 | A1* | 11/2009 | Dekker | H01L 23/5387 257/690 |
| 2010/0294544 | A1* | 11/2010 | Momota | H05K 3/4691 174/254 |
| 2013/0118791 | A1* | 5/2013 | Okamoto | H05K 1/186 174/260 |

FOREIGN PATENT DOCUMENTS

| | | |
|---|---|---|
| JP | 2007-80857 A | 3/2007 |
| JP | 2010-62429 A | 3/2010 |

\* cited by examiner

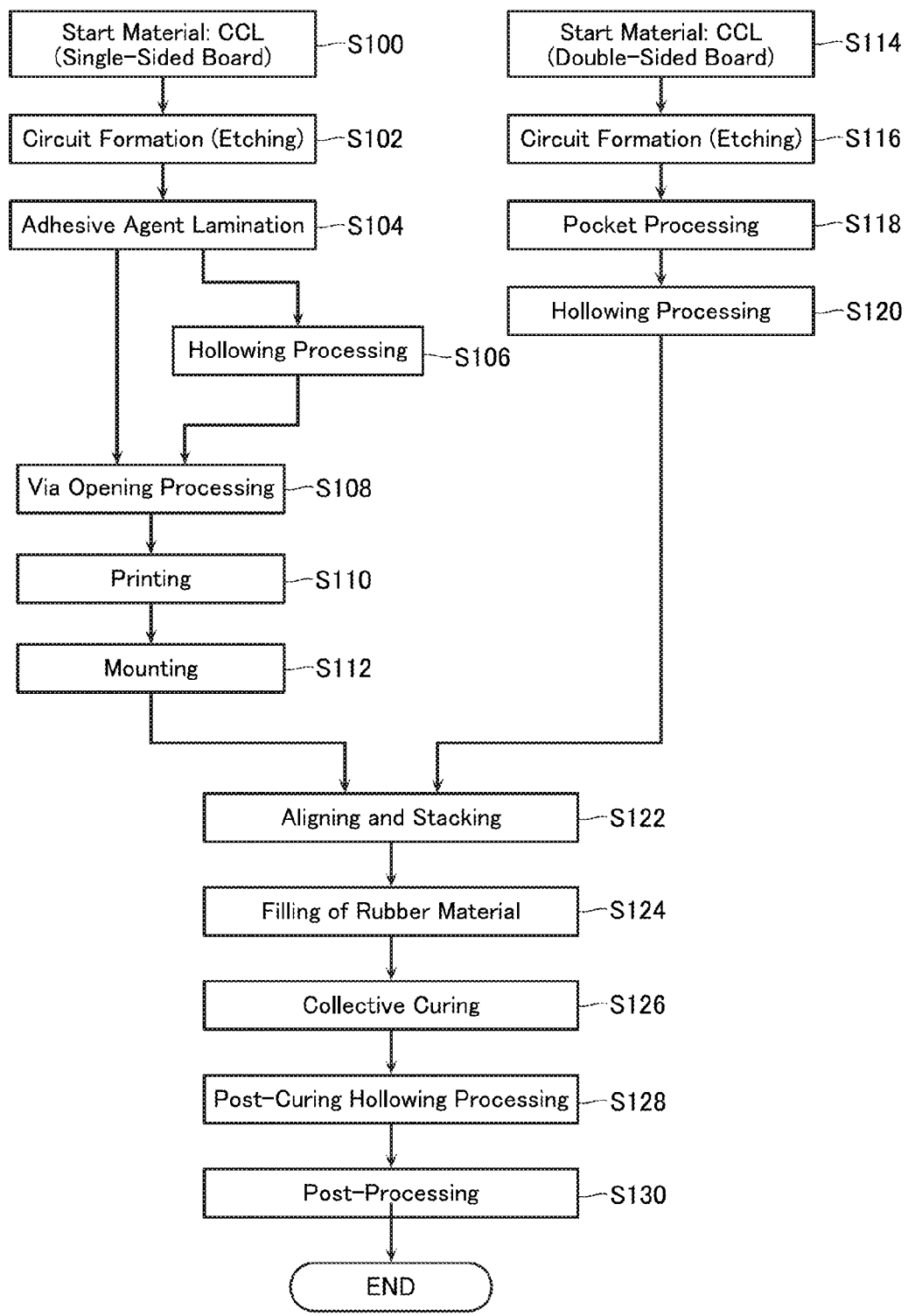

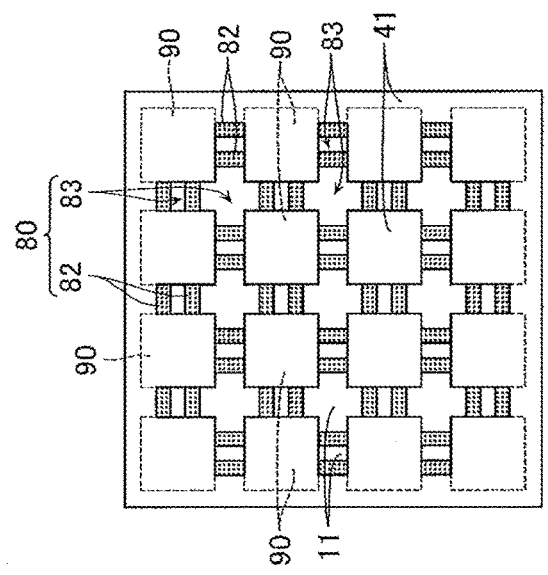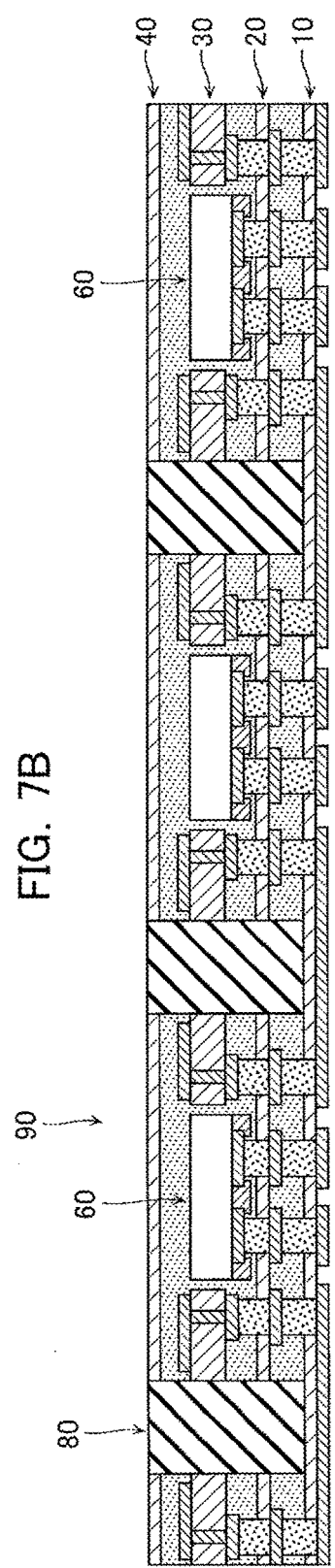

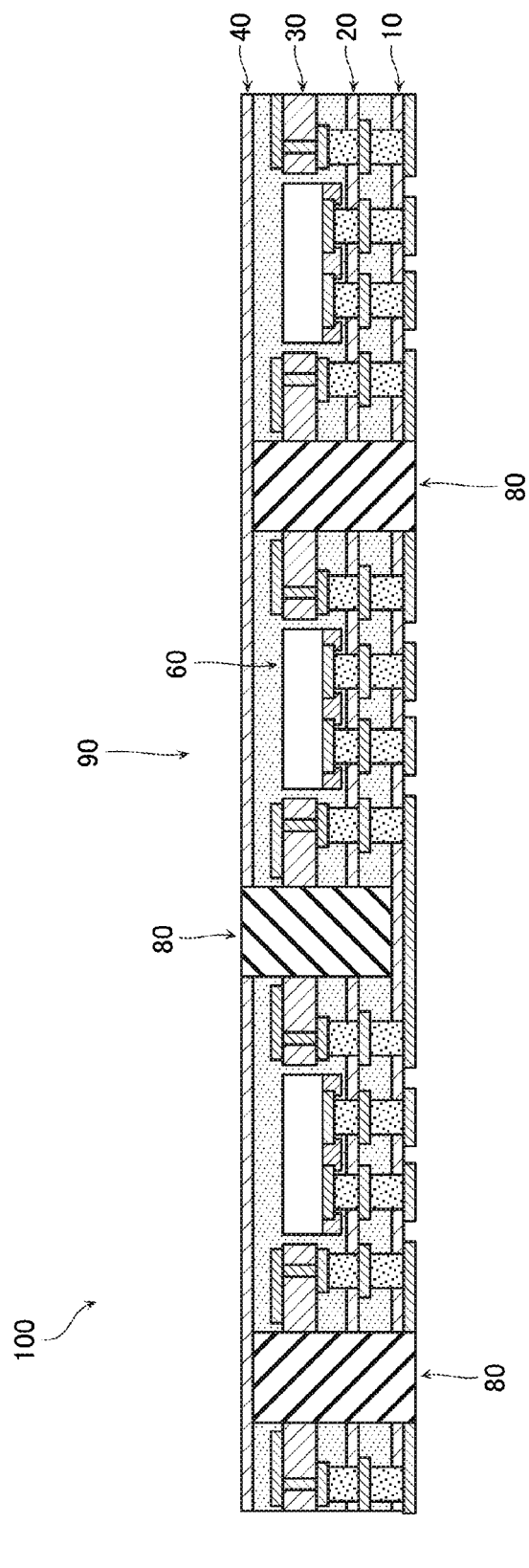

MULTI-LAYER WIRING BOARD AND METHOD OF MANUFACTURING THE SAME

CROSS-REFERENCE TO RELATED APPLICATIONS

This application is based upon and claims the benefit of priority from the prior Japanese Patent Application No. 2013-89169, filed on Apr. 22, 2013, the entire contents of which are incorporated herein by reference.

BACKGROUND OF THE INVENTION

Field of the Invention

This invention relates to a multi-layer wiring board having a plurality of printed wiring bases stacked therein via an adhesive layer, and a method of manufacturing the same.

Description of the Prior Art

Known, among wiring boards of a multi-layer structure having a plurality of printed wiring bases stacked therein via an adhesive layer, as a component built-in board having, for example, an electronic component such as a semiconductor component, or the like, built in thereto, is the electronic device utilizing a multi-layer printed wiring board disclosed in Japanese Unexamined Patent Application Publication No. 2007-80857 A. This electronic device comprises a multi-layer structure in which an electronic component is built in between printed wiring boards, and comprises characteristics of having a certain degree of flexibility and at the same time securing an arbitrary layer spacing while advancing film-thinning.

However, in the above-described electronic device of conventional technology disclosed in Japanese Unexamined Patent Application Publication No. 2007-80857 A, the more film-thinning is advanced, the greater the occurrence of various kinds of problems such as a kink depending on mechanical strength or flexibility of the wiring board in each layer, hence further improvement in mechanical strength and flexibility accompanying the film-thinning is required.

SUMMARY OF THE INVENTION

This invention has an object of overcoming the above-mentioned problems due to the conventional technology to provide a multi-layer wiring board having improved mechanical strength and flexibility, and a method of manufacturing the same.

A multi-layer wiring board according to an embodiment of the present invention is configured having stacked therein, in a stacking direction, via an adhesive layer, a plurality of printed wiring bases in each of which a wiring pattern and a via are formed on/in a resin base, and includes: a plurality of multi-layer wiring portions disposed in a matrix; and a movable portion configured from an elastic member, the movable portion joining the plurality of multi-layer wiring portions in a crisscross manner.

The multi-layer wiring board according to the embodiment of the present invention includes a movable portion configured from an elastic member and joining a plurality of multi-layer wiring portions in a crisscross manner, hence flexibility of the multi-layer wiring board is improved by this movable portion. Therefore, due to a difference in bending rigidity between a part of the printed wiring base in a close vicinity of the movable portion and another portion of the printed wiring base, strain due to flexing is almost entirely borne by the movable portion, and there is almost no occurrence of strain in the multi-layer wiring portion. Moreover, the movable portion is displaceable in, for example, a surface direction, hence the multi-layer wiring portion comprises characteristics of being able to expand/contract in a shearing direction and return to a normal state after expansion/contraction.

In an embodiment of the multi-layer wiring board, a void portion is formed in a certain region surrounded by the plurality of multi-layer wiring portions and the movable portion.

In another embodiment of the multi-layer wiring board, the multi-layer wiring portion comprises a component built-in portion having an electronic component built in internally thereto in the stacking direction.

In yet another embodiment of the multi-layer wiring board, the elastic member is configured from heat-resistant rubber.

In yet another embodiment of the multi-layer wiring board, the elastic member is configured from silicone rubber or fluoro rubber.

In yet another embodiment of the multi-layer wiring board, the movable portion is formed on a front and back of the plurality of printed wiring bases.

A method of manufacturing a multi-layer wiring board according to an embodiment of the present invention, the multi-layer wiring board being configured having stacked therein, in a stacking direction, via an adhesive layer, a plurality of printed wiring bases in each of which a wiring pattern and a via are formed on/in a resin base, comprises the steps of: forming the wiring pattern and the via on/in a plurality of the resin bases and forming the adhesive layer on the plurality of the resin bases, and performing a hollowing processing in a thickness direction of a certain place in a periphery of a plurality of multi-layer wiring portions disposed in a matrix as viewed in a planar manner, thereby forming a plurality of the printed wiring bases provided with an opening; aligning and stacking a plurality of the printed wiring bases such that the plurality of multi-layer wiring portions and the opening overlap in the stacking direction; filling an elastic member into the opening and curing a plurality of the printed wiring bases; and performing a hollowing processing in the stacking direction of a certain region surrounded by the plurality of multi-layer wiring portions and the elastic member.

The method of manufacturing a multi-layer wiring board according to the embodiment of the present invention makes it possible to manufacture, cheaply and simply, a multi-layer wiring board displaying the above-described working effects.

In an embodiment of the method of manufacturing a multi-layer wiring board, in the step of forming the printed wiring base, a place corresponding to the multi-layer wiring portion of at least one of the plurality of resin bases has formed thereat a component-dedicated opening having an electronic component built in thereto, and in the step of stacking, stacking is performed after the electronic component has been housed in the component-dedicated opening.

BRIEF DESCRIPTION OF THE DRAWINGS

FIG. 4 is a flowchart showing a manufacturing process of same multi-layer wiring board.

FIG. 7A is a top view showing same multi-layer wiring board on a manufacturing process basis.

FIG. 7B is a cross-sectional view showing same multi-layer wiring board on a manufacturing process basis.

FIG. 11 is a cross-sectional view showing a structure of a multi-layer wiring board according to a fifth embodiment of the present invention.

DESCRIPTION OF THE PREFERRED EMBODIMENTS

A multi-layer wiring board and a method of manufacturing the same according to embodiments of this invention will be described in detail below with reference to the accompanying drawings.

First Embodiment

Figure 1:
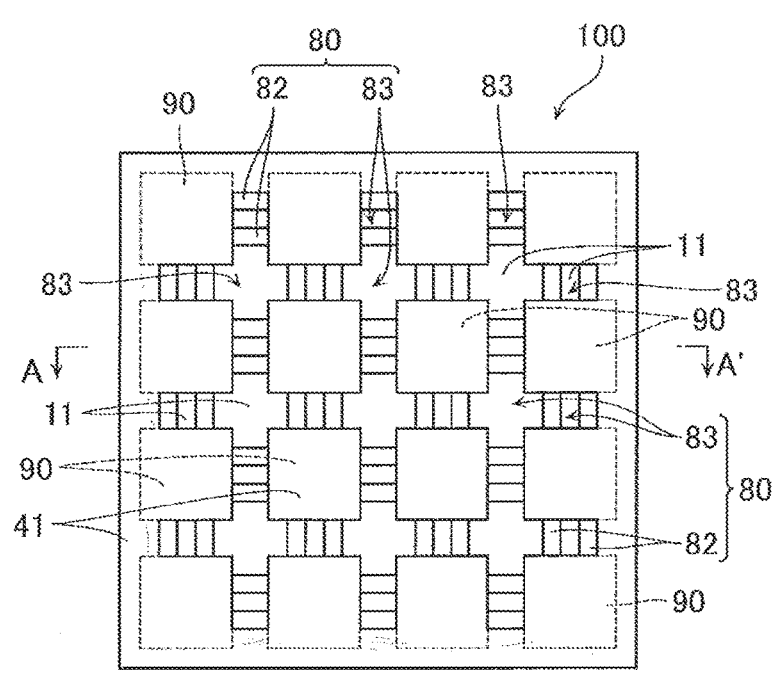
FIG. 1 is a top view showing schematically a structure of a multi-layer wiring board according to a first embodiment of the present invention.
Figure 2:
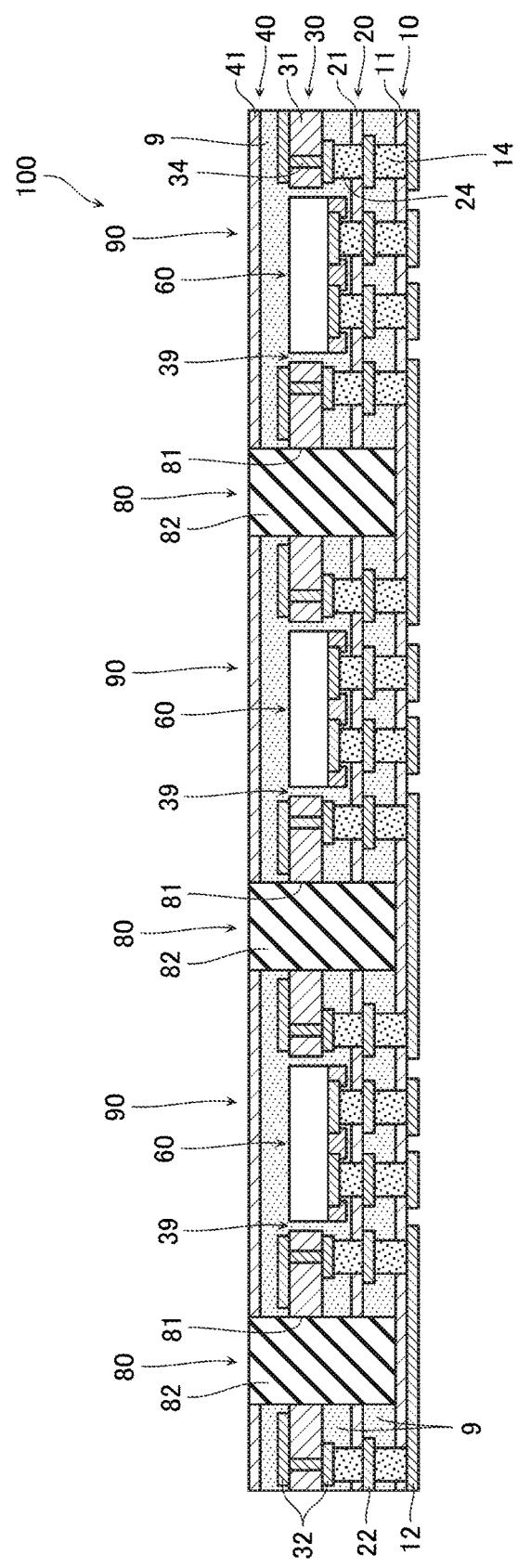
FIG. 2 is a cross-sectional view taken along the line A-A' of FIG. 1.
Figure 3:
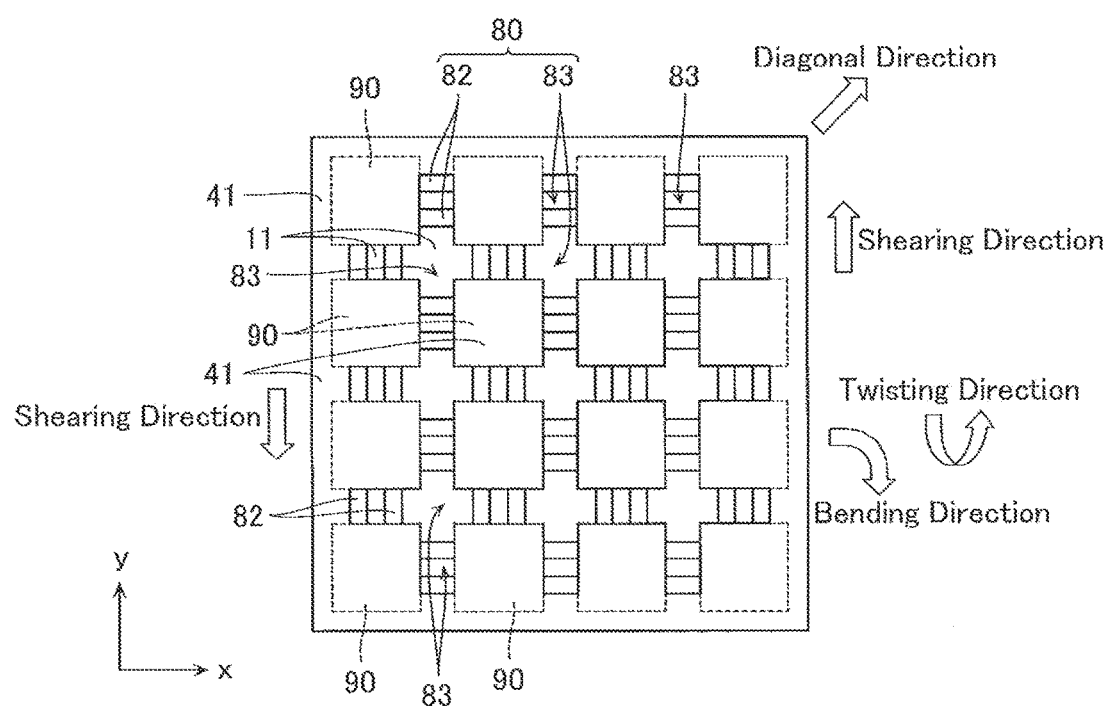
FIG. 3 is a top view for explaining modes of displacement of same multi-layer wiring board.

First, a configuration of a multi-layer wiring board according to a first embodiment will be described with reference to FIGS. 1 to 3. FIG. 1 is a top view showing schematically a structure of the multi-layer wiring board according to the first embodiment of the present invention. FIG. 2 is a cross-sectional view taken along the line A-A' of FIG. 1. FIG. 3 is a top view for explaining modes of displacement of the multi-layer wiring board.

As shown in FIG. 2, a multi-layer wiring board 100 according to the first embodiment includes a first printed wiring base 10, a second printed wiring base 20, a third printed wiring base 30, and a fourth printed wiring base 40 that are stacked collectively by thermal compression bonding, via an adhesive layer 9. The fourth printed wiring base 40 functions here as a coverlay provided in a most superficial layer. The adhesive layer 9 is configured from, for example, a thermosetting or thermoplastic adhesive agent of an epoxy system or an acrylic system, and so on.

The multi-layer wiring board 100 includes an IC chip 60 which is built in to a component-dedicated opening 39 formed in a third resin base 31 of the third printed wiring base 30, in a state of being sandwiched by the second and fourth printed wiring bases 20 and 40. Therefore, the multi-layer wiring board 100 functions here as a component built-in board, and the IC chip 60 is built in to a multi-layer wiring portion 90 as a rectangular region of the kind shown in FIG. 1.

The first through fourth printed wiring bases 10 to 40 comprise a first resin base 11, a second resin base 21, the third resin base 31, and a fourth resin base 41, respectively.

In addition, the first through third printed wiring bases 10 to 30 comprise signal-dedicated wiring (wiring patterns) 12, 22, and 32 formed on surfaces of the first through third resin bases 11 to 31. The fourth printed wiring base 40 comprises the adhesive layer 9.

Note that the signal-dedicated wiring 12 and 22 are formed on one of surfaces of the first and second resin bases 11 and 21, and the signal-dedicated wiring 32 is formed on both surfaces of the third resin base 31. In this way, the first and second printed wiring bases 10 and 20 are formed based on a single-sided copper clad laminated board (single-sided CCL), and the third printed wiring base 30 is formed based on a double-sided copper clad laminated board (double-sided CCL).

The first through fourth resin bases 11 to 41 are each configured by, for example, a resin film having a thickness of about 25 µm. Now, employable as the resin film are, for example, a resin film configured from the likes of a polyimide, polyolefin, or liquid crystal polymer (LCP), or a resin film configured from a thermosetting epoxy resin, and so on. The signal-dedicated wiring 12 to 32 are configured by pattern-forming a conductive material such as copper foil. Due to the first through fourth resin bases 11 to 41 and the signal-dedicated wiring 12 to 32 of the above kind, the multi-layer wiring board 100 acting as a component built-in board can be thinned.

In addition, the first and second printed wiring bases 10 and 20 include, respectively, signal-dedicated vias 14 and 24 formed by filling in via holes formed in the first and second resin bases 11 and 21. The signal-dedicated via 14 electrically connects between the signal-dedicated wiring 12 and 22, and the signal-dedicated via 24 electrically connects between the signal-dedicated wiring 22 and 32.

Moreover, the signal-dedicated via 24 is electrically connected to the IC chip 60. Note that the third printed wiring base 30 includes a signal-dedicated via 34 which is formed by plating inside a via hole of the third resin base 31 and which electrically connects to each other the signal-dedicated wiring 32 formed on both surfaces of the third resin base 31.

The signal-dedicated vias 14 and 24 are configured from a conductive paste filled into the respective via holes. The conductive paste is configured from a paste that includes, for example, at least one kind of metallic particle of low electrical resistance selected from the likes of nickel, gold, silver, copper, aluminum, and iron, and at least one kind of metallic particle of low melting point selected from the likes of tin, bismuth, indium, and lead, the paste having mixed therein a binder component whose main component is an epoxy, an acrylic, a urethane, and so on.

The conductive paste configured in this way enables the metal of low melting point contained therein to melt and form an alloy at a temperature of 200° C. or less, specifically the likes of copper or silver comprise characteristics allowing an intermetallic compound to be formed. Note that the conductive paste may also be configured by a nanopaste in which, for example, a filler of the likes of gold, silver, copper, or nickel with a nanolevel particle diameter is mixed into a binder component of the above-described kind.

Moreover, the conductive paste may also be configured by a paste having metallic particles of the above-described nickel, and so on, mixed into a binder component of the above-described kind. In this case, the conductive paste is characterized in that electrical connection is performed by contact between fellow metallic particles. Employable as a method of filling the conductive paste into the via holes is, for example, a printing method, a spin coating method, a spray coating method, a dispensing method, a laminating method, a method combining use of these methods, and so on.

In addition, as shown in FIGS. 1 and 2, the multi-layer wiring board 100 in the first embodiment comprises a movable portion 80 which includes an elastic member 82 formed by filling in an opening 81 that hollows out, from a most superficial layer toward a lowermost layer, the fourth through second printed wiring bases 40 to 20 and the adhesive layer 9 as far as an upper surface of the first resin base 11.

As shown in FIG. 1, the movable portion 80 is formed in the fourth through second printed wiring bases 40 to and the adhesive layer 9 in a periphery of a matrix-shaped plurality of multi-layer wiring portions 90 disposed at a certain interval as viewed in a planar manner. The plurality of multi-layer wiring portions 90 are disposed in a matrix of at least 2×2 or more. The movable portion 80 is configured from the elastic member 82 and a void portion 83 in a bridge form joining between the plurality of multi-layer wiring portions 90 such that each of the multi-layer wiring portions 90 is displaceable in a stacking direction and a direction of surfaces of the fourth through second printed wiring bases 40 to 20.

The elastic member 82 is configured from, for example, heat-resistant rubber (silicone rubber or fluoro rubber). The elastic member 82 has its elastic modulus set to about 1 to 100 MPa. The void portion 83 is formed in a certain region surrounded by the multi-layer wiring portion 90 and the elastic member 82. Similarly to the above-described opening 81, the void portion 83 hollows out all of the fourth through first printed wiring bases 40 to 10, and is formed hollowing out a part of the elastic member 82 and the first through fourth printed wiring bases 10 to 40, as required.

By comprising the movable portion 80 configured in this way, the multi-layer wiring board 100 comprises a structure displaceable as shown in FIG. 3. That is, although the multi-layer wiring board 100 hardly displaces at all in x and y directions of FIG. 3 due to material characteristics of the first resin base 11, it does displace in a shearing direction, a bending direction, and a twisting direction along x and y in FIG. 3. In addition, the multi-layer wiring board 100 has a structure allowing pseudo-expansion/contraction in a diagonal direction.

Citable as the closest action to such an expanding/contracting action is the expanding/contracting action in a lattice-woven fabric. Moreover, the multi-layer wiring board 100, after being displaced due to expansion/contraction, and so on, is returned to a normal state by elasticity of the elastic member 82 of the movable portion 80. Note that a corner portion of the multi-layer wiring portion 90 as the rectangular region as viewed in a planar manner may undergo chamfering of R1 or more.

Normally, in a resin film of the likes of PI or LCP, an allowable strain is of the order of several percent, hence in the case of adopting in the movable portion 80 a structure such that, for example, one elastic member 82 is provided as a bridge between two multi-layer wiring portions 90, it becomes structurally difficult to provide expandability/contractibility other than those returning to normal as described above.

Therefore, in the multi-layer wiring board 100 according to the present embodiment, it was decided to provide the movable portion 80 configured from the elastic member 82 having a structure such as to join between each of the multi-layer wiring portions 90 by a bridge-shaped plurality of the elastic members 82 in a lattice shape as viewed in a planar manner, and the void portion 83 formed in the certain region of the above-described kind.

Due to the above-described movable portion 80, flexibility of the multi-layer wiring board 100 improves. Moreover, due to a difference in bending rigidity between a part of the first through fourth printed wiring bases 10 to 40 in a close vicinity of the movable portion 80 and another portion of the printed wiring bases, strain due to flexing is almost entirely borne by the moving portion 80, and there is almost no occurrence of strain in the multi-layer wiring portion 90. As a result, the multi-layer wiring board 100 can maintain a high degree of mechanical strength in a close vicinity of the multi-layer wiring portion 90 and the IC chip 60. Note that similar working effects can be displayed even when adopting a structure where the IC chip 60 is not built in to the multi-layer wiring portion 90.

Figure 5A:
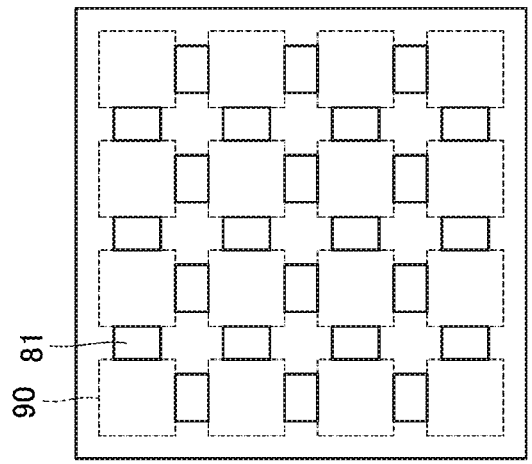
FIG. 5A is a top view showing same multi-layer wiring board on a manufacturing process basis.
Figure 5B:
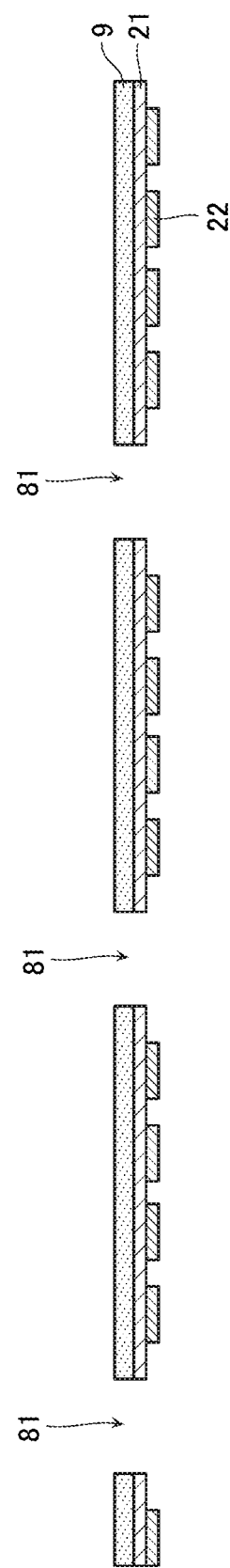
FIG. 5B is a cross-sectional view showing same multi-layer wiring board on a manufacturing process basis.
Figure 6A:
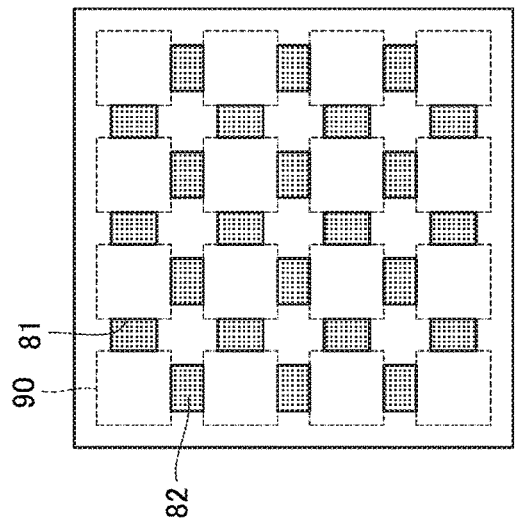
FIG. 6A is a top view showing same multi-layer wiring board on a manufacturing process basis.
Figure 6B:
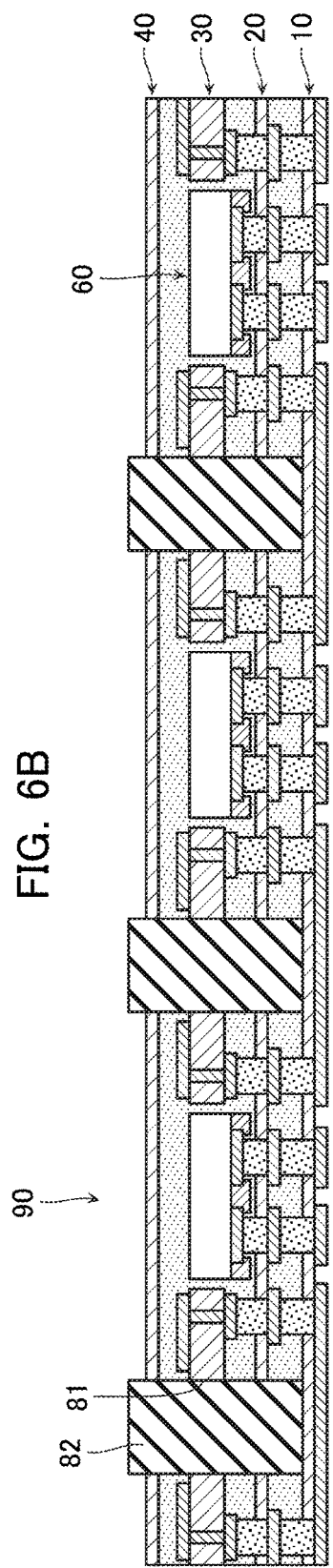
FIG. 6B is a cross-sectional view showing same multi-layer wiring board on a manufacturing process basis.

Next, a method of manufacturing the multi-layer wiring board 100 according to the first embodiment will be described with reference to FIGS. 4, 5A, 5B, 6A, 6B, 7A, and 7B. FIG. 4 is a flowchart showing a manufacturing process of the multi-layer wiring board. FIGS. 5A, 6A, and 7A are each a top view showing the multi-layer wiring board on a manufacturing process basis. FIGS. 5B, 6B, and 7B are each a cross-sectional view showing the multi-layer wiring board on a manufacturing process basis. First, in the case of the first and second printed wiring bases 10 and 20, a single-sided CCL is prepared as a start material (step S100), circuit formation of the signal-dedicated wiring is performed by etching, or the like (step S102), and an adhesive agent is laminated on a surface on an opposite side to a circuit formation surface (step S104). In the case of the fourth printed wiring base 40, the adhesive agent is laminated skipping the circuit formation.

Then, as shown in FIGS. 5A and 5B, a hollowing processing is performed as required in a thickness direction on a certain place joining each of the multi-layer wiring portions 90 in a periphery of the plurality of multi-layer wiring portions 90, thereby forming the opening 81 (step S106). The hollowing processing is performed using a laser or a router. FIGS. 5A and 5B illustrate the case of forming the opening 81 for, for example, the single-sided CCL which is to be the second printed wiring base 20.

In the case of both single-sided CCLs having the opening 81 formed therein and those not having the opening 81 formed therein, a via opening is processed (step S108), the conductive paste is printed to form the signal-dedicated via (step S110), and the IC chip 60 is mounted on the signal-dedicated via at a certain place (step S112). On the other hand, in the case of the third printed wiring base 30, a double-sided CCL is prepared as a start material (step S114).

Then, circuit formation of the signal-dedicated wiring is performed by etching, or the like (step S116), pocket processing of the component-dedicated opening 39 is performed (step S118), and similarly to in above-described step S106, hollowing processing is performed in the thickness direction on a certain place to form the opening 81 (step S120).

Subsequently, the first through fourth printed wiring bases 10 to 40 formed as described above are stacked positioning the IC chip 60 and aligning the opening 81 (step S122), and a rubber material acting as the elastic member 82 is filled into the opening 81 and collective curing performed (step S124). As a result, as shown in FIGS. 6A and 6B, a prototype of the multi-layer wiring board 100 in a state where the elastic member 82 is filled into the opening 81, is formed.

Then, as mentioned above, a certain region surrounded by the multi-layer wiring portion 90 and the elastic member 82, and part of the elastic member 82 undergo hollowing processing after curing, thereby forming the void portion 83 (step S128). At this time, the elastic member 82 protruding above the fourth printed wiring base 40 is simultaneously removed.

As a result, as shown in FIGS. 7A and 7B, the multi-layer wiring board 100 that has formed therein in a periphery of the multi-layer wiring portion 90 the movable portion 80 configured from the elastic member 82 and the void portion 83, is manufactured. Note that subsequently, post-processing in which, for example, resist is formed, or the likes of land surface processing is performed, is implemented (step S130), and processing due to the present flowchart is ended.

Second Embodiment

Figure 8:
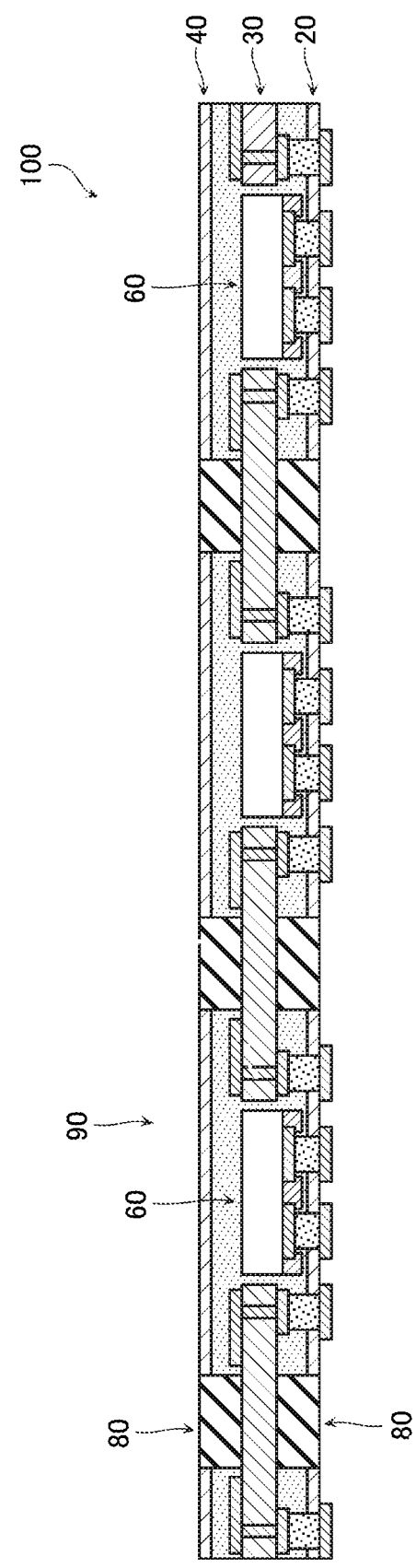
FIG. 8 is a cross-sectional view showing a structure of a multi-layer wiring board according to a second embodiment of the present invention.

FIG. 8 is a cross-sectional view showing a structure of a multi-layer wiring board according to a second embodiment of the present invention. As shown in FIG. 8, a multi-layer wiring board 100 according to the second embodiment differs from that of the first embodiment in omitting the first printed wiring base 10 and including two kinds of movable portions 80 on front and back thereof.

That is, openings 81 are formed penetrating the second and fourth printed wiring bases 20 and 40 and the adhesive layer 9 so as to reach each of surfaces of the third resin base 31 of the third printed wiring base 30, and the movable portions 80 are configured by the elastic member 82 filled into each of the openings 81 and by the void portion 83. The movable portions 80 are formed facing each other in the stacking direction via the third printed wiring base 30.

While the above-described first embodiment can mainly handle one-directional bending of the multi-layer wiring board 100, the second embodiment is configured to be also capable of sufficiently handling two-directional bending of the multi-layer wiring board 100 because of the movable portions 80 on front and back thereof, and can display similar working effects to those of the first embodiment.

Third and Fourth Embodiments

Figure 9:
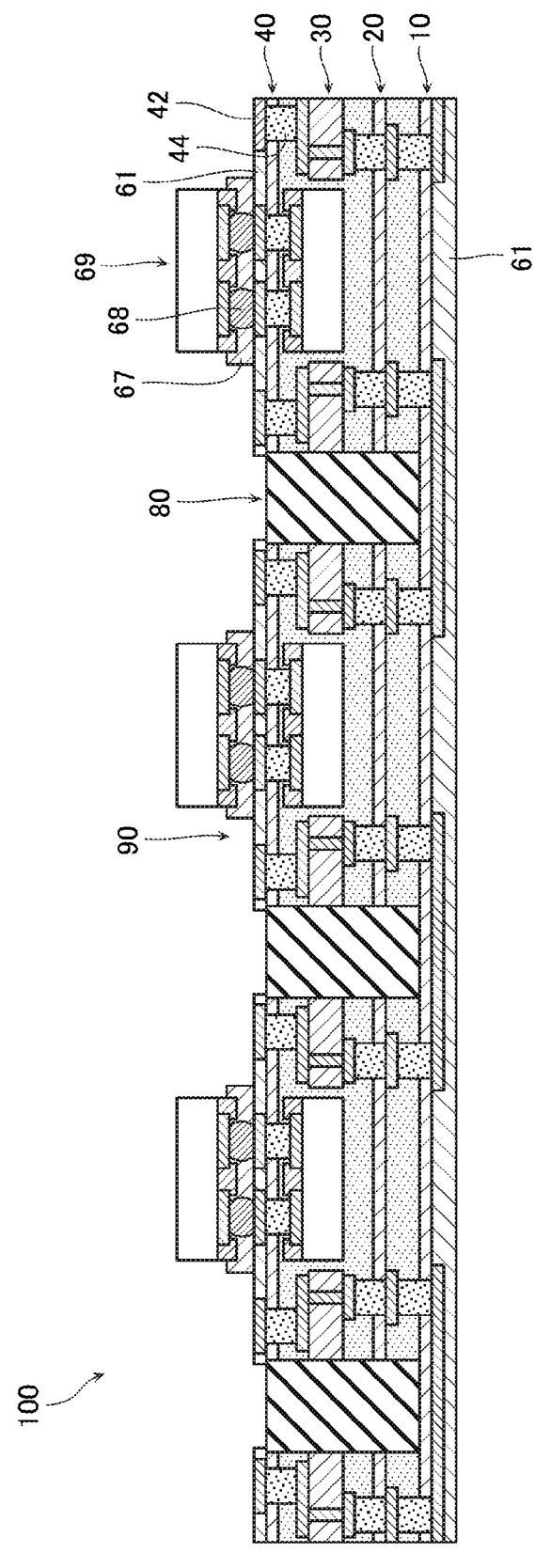
FIG. 9 is a cross-sectional view showing a structure of a multi-layer wiring board according to a third embodiment of the present invention.
Figure 10:
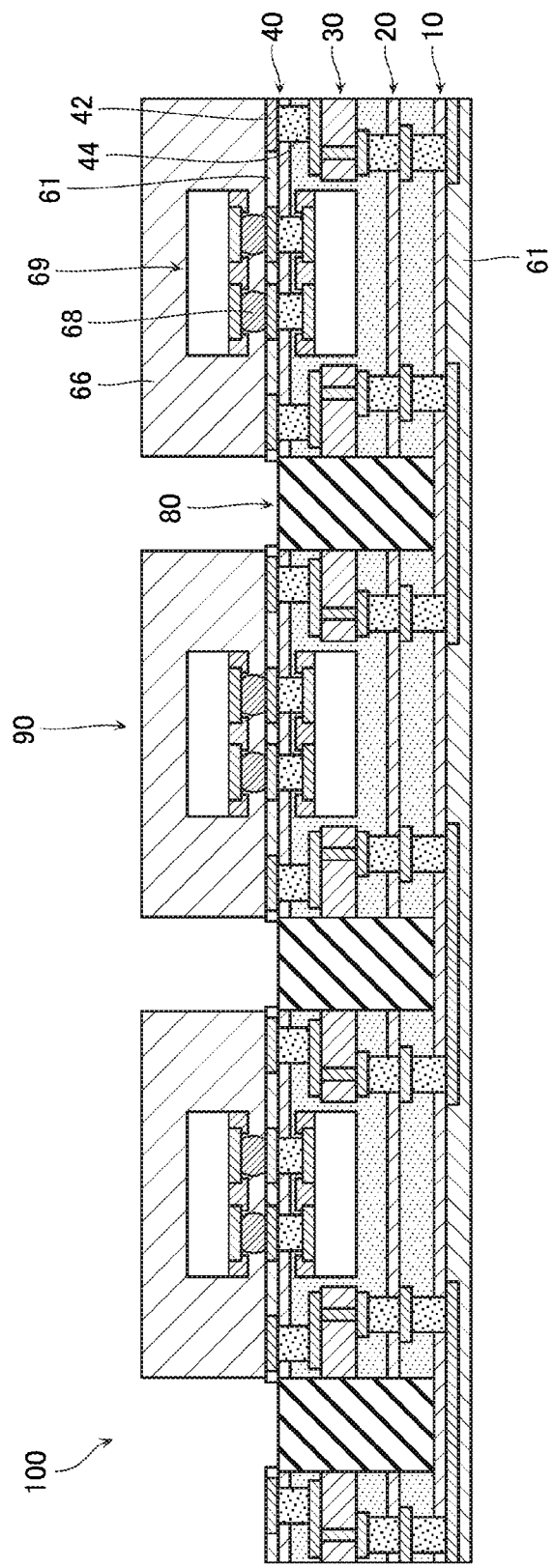
FIG. 10 is a cross-sectional view showing a structure of a multi-layer wiring board according to a fourth embodiment of the present invention.

FIG. 9 is a cross-sectional view showing a structure of a multi-layer wiring board according to a third embodiment of the present invention, and FIG. 10 is a cross-sectional view showing a structure of a multi-layer wiring board according to a fourth embodiment of the present invention. As shown in FIGS. 9 and 10, multi-layer wiring boards 100 according to the third embodiment and the fourth embodiment differ from that of the first embodiment in having a signal-dedicated wiring 42 and a signal-dedicated via 44 formed in the fourth printed wiring base 40, in having an electronic component 69 surface mounted on the signal-dedicated wiring 42 in the multi-layer wiring portion 90 via a solder bump 68, and, furthermore, in having resist 61 formed on signal-dedicated wiring 12 and 42 sides of the first and fourth printed wiring bases 10 and 40.

Note that the multi-layer wiring board 100 according to the third embodiment has the electronic component 69 sealed by underfill 67 as shown in FIG. 9, and the multi-layer wiring board 100 according to the fourth embodiment has the electronic component 69 sealed by mold resin 66 as shown in FIG. 10. Even when the electronic component 69 is surface mounted on the multi-layer wiring board 100 in this way, the multi-layer wiring board 100 can display similar working effects to those of the first embodiment.

Fifth Embodiment

FIG. 11 is a cross-sectional view showing a structure of a multi-layer wiring board according to a fifth embodiment of the present invention. As shown in FIG. 11, a multi-layer wiring board 100 according to the fifth embodiment differs from that of the first embodiment in including the movable portion 80 alternately on front and back thereof. That is, the opening 81 is disposed alternately on front and back of the multi-layer wiring board 100 at a place where the opening 81 is formed penetrating the fourth through second printed wiring bases 40 to 20 and the adhesive layer 9 as far as an upper surface of the first resin base 11, and a place where the opening 81 is formed penetrating the first through third printed wiring bases 10 to 30 and the adhesive layer 9 to a lower surface of the fourth resin base 41. The movable portion 80 is configured by the elastic member 82 filled into the opening 81 disposed in this way, and the void portion 83. Such a structure makes it possible for similar working effects to those of the first embodiment and similar working effects to those of the second embodiment to be displayed in combination.

Note that in the case where, for example, the above-described multi-layer wiring board 100 has an electronic component such as a sensor built in to the multi-layer wiring portion 90 as the IC chip 60, the multi-layer wiring board 100 has a structure in which the multi-layer wiring portions 90 having this electronic component built in thereto are continuously coupled by the movable portion 80 configured from the elastic member 82 and the void portion 83. As a result, it is possible to adopt a structure that provides good expandability/contractibility in the shearing direction in addition to the bending and twisting directions as mentioned above, hence the above-described multi-layer wiring board 100 can be used in, for example, the medical field and a multiplicity of other applications.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A multi-layer wiring board, comprising:
  a plurality of printed wiring bases stacked, in a stacking direction, by an adhesive layer, the plurality of printed wiring bases each having a wiring pattern formed on a resin base and a via formed in the resin base;
  a plurality of multi-layer wiring portions disposed in a matrix of at least 2×2 or more; and
  a movable portion configured from an elastic member, the movable portion is provided between the plurality of multi-layer wiring portions to join the plurality of multi-layer wiring portions in a crisscross manner,
  wherein each of the multi-layer wiring portions comprises a component built-in portion having an electronic component built in internally thereto in the stacking direction, the electronic component being disposed in an opening provided to a first resin base of the resin bases,
  the multi-layer wiring board includes a recess recessed from one surface along the stacking direction and penetrating the first resin base provided with the opening,
  the elastic member of the movable portion fills the recess in the stacking direction.

2. The multi-layer wiring board according to claim 1, wherein
    a void portion is formed in a certain region surrounded by the plurality of multi-layer wiring portions and the movable portion.

3. The multi-layer wiring board according to claim 1, wherein
    the elastic member is configured from heat-resistant rubber.

4. The multi-layer wiring board according to claim 2, wherein
    the elastic member is configured from heat-resistant rubber.

5. The multi-layer wiring board according to claim 1, wherein
    the elastic member is configured from silicone rubber or fluoro rubber.

6. The multi-layer wiring board according to claim 2, wherein
    the elastic member is configured from silicone rubber or fluoro rubber.

\* \* \* \* \*